(12) United States Patent
Lin (10) Patent No.: US 8,981,381 B2
(45) Date of Patent: *Mar. 17, 2015

(54) GAN-BASED SCHOTTKY DIODE HAVING DUAL METAL, PARTIALLY RECESSED ELECTRODE

(71) Applicant: Vishay General Semiconductor LLC, Hauppauge, NY (US)

(72) Inventor: Yih-Yin Lin, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/678,572

(22) Filed: Nov. 16, 2012

(65) Prior Publication Data

US 2014/0138698 A1    May 22, 2014

(51) Int. Cl.
| | | |
|---|---|---|
| *H01L 29/15* | (2006.01) | |
| *H01L 31/0256* | (2006.01) | |
| *H01L 29/872* | (2006.01) | |
| *H01L 29/20* | (2006.01) | |
| *H01L 29/66* | (2006.01) | |
| *H01L 29/417* | (2006.01) | |
| *H01L 29/778* | (2006.01) | |

(52) U.S. Cl.
CPC .......... *H01L 29/872* (2013.01); *H01L 29/2003* (2013.01); *H01L 29/66143* (2013.01); *H01L 29/417* (2013.01); *H01L 29/778* (2013.01); *H01L 29/7786* (2013.01)
USPC ......................................................... 257/76

(58) Field of Classification Search
USPC ............. 257/76, E21.371, E21.387, E21.441, 257/E21.445, E21.448–E21.452, 552–562, 257/E29.033, 125, 164, 198, 514, 192, 194, 257/285, E29.246–E29.253, 257/E21.403–E21.407, E21.395, E21.399, 257/9–39, E39.003, E39.012–E39.15, 257/E29.042, E29.179; 438/235–238
See application file for complete search history.

(56) References Cited

U.S. PATENT DOCUMENTS

| | | | |
|---|---|---|---|
| 8,704,295 B1 | 4/2014 | Darwish et al. | |
| 2007/0132037 A1* | 6/2007 | Hoshi et al. | 257/396 |
| 2008/0217625 A1* | 9/2008 | Kuroda et al. | 257/76 |

(Continued)

FOREIGN PATENT DOCUMENTS

| | | |
|---|---|---|
| JP | 2009-525776 | 10/2009 |
| JP | 2010-205833 | 9/2010 |

(Continued)

*Primary Examiner* — Dao H Nguyen
*Assistant Examiner* — Tram H Nguyen
(74) *Attorney, Agent, or Firm* — Stuart H. Mayer; Karin L. Williams; Mayer & Williams PC (57) ABSTRACT

A semiconductor device includes a substrate, a first active layer disposed over the substrate and a second active layer disposed on the first active layer. The second active layer has a higher bandgap than the first active layer such that a two-dimensional electron gas layer arises between the first active layer and the second active layer. A first electrode has a first portion disposed in a recess in the second active layer and a second portion disposed on the second active layer such that a Schottky junction is formed therewith. The first portion of the first electrode has a lower Schottky potential barrier than the second portion of the first electrode. A second electrode is in contact with the first active layer. The second electrode establishes an ohmic junction with the first active layer.

20 Claims, 9 Drawing Sheets

(56) References Cited

U.S. PATENT DOCUMENTS

| | | |
|---|---|---|
| 2008/0217725 A1 | 9/2008 | Tu et al. |
| 2009/0309181 A1 | 12/2009 | Hsieh |
| 2010/0289109 A1 | 11/2010 | Henning et al. |
| 2010/0314707 A1 | 12/2010 | Yedinak et al. |
| 2012/0037982 A1 | 2/2012 | Yedinak et al. |
| 2012/0098082 A1 | 4/2012 | Hsu et al. |
| 2012/0181652 A1 | 7/2012 | Qu et al. |
| 2012/0187478 A1 | 7/2012 | Takaya |
| 2012/0205772 A1 | 8/2012 | Chen |
| 2012/0241898 A1 | 9/2012 | Ohta et al. |
| 2012/0280281 A1* | 11/2012 | Bahl ............................ 257/201 |
| 2013/0009165 A1* | 1/2013 | Park et al. ...................... 257/76 |
| 2013/0015460 A1* | 1/2013 | Chen et al. ...................... 257/76 |
| 2013/0200451 A1 | 8/2013 | Yilmaz et al. |
| 2013/0248874 A1* | 9/2013 | Kuraguchi ...................... 257/76 |
| 2013/0256679 A1* | 10/2013 | Yao et al. ........................ 257/76 |

FOREIGN PATENT DOCUMENTS

| | | |
|---|---|---|
| KR | 10-2007-0092473 | 9/2007 |
| KR | 10-2010-0122281 | 11/2010 |

\* cited by examiner

FIG. 3 (a) and (b)

FIG. 4

FIG. 5 (a) and (b)

GAN-BASED SCHOTTKY DIODE HAVING DUAL METAL, PARTIALLY RECESSED ELECTRODE

BACKGROUND

A Schottky diode is a semiconductor device formed by a metal contacting a semiconductor layer. The junction between the metal and the semiconductor layer forms a rectifying junction with improved diode switching capability as compared to p-n junction diodes formed entirely in a semiconductor layer. Schottky diodes thus have lower turn-on voltages and faster switching speeds as compared to p-n junction diodes. Schottky diodes are ideal for applications where switching loss is the major source of energy consumption, such as in switch-mode power supplies (SMPS).

Electronic devices made from nitride-based compound semiconductor materials are known. Such electronic devices are also known as III-Nitride semiconductor devices as being formed from Group III nitride based materials. Nitride-based compound semiconductor devices are desirable for their wider band gap and higher breakdown voltage characteristics, rendering them suitable for high voltage and high temperature applications. In particular, III-V gallium nitride (GaN) compound semiconductor Schottky diodes having a high breakdown voltage and a low on-resistance have been described. The efficiency of switch-mode power supplies can be improved through the use of III-Nitride semiconductor Schottky barrier diodes.

III-nitride based semiconductor devices are capable of maximizing electron mobility by forming a 2-dimensional electron gas at the hetero-interface of two different III-nitrides such as AlGaN and GaN. The 2-dimensional electron gas is believed to compensate for the strain-induced piezoelectric polarization charges and spontaneous polarization charges arising from the non-ideal nature of the III-nitride crystal structure. The 2-dimensional electron gas is quantum-confined in the band bending region of a hetero junction where a narrower bandgap III-nitride (e.g., GaN) joins a larger bandgap III-nitride (e.g., AlGaN). Thus in a Schottky-like diode, electrons will flow along a confined channel between the anode electrode and the cathode electrode. The charge density is determined by hetero-structure parameters such as the Al composition, AlGaN layer thickness, and inherent crystal polarity. In III-nitride power devices, the charge density will respond to the applied gate voltage and can be removed locally according to changes in the energy band gaps. Therefore, the switching speed of III-nitride power devices can be very rapid.

Figure 1:
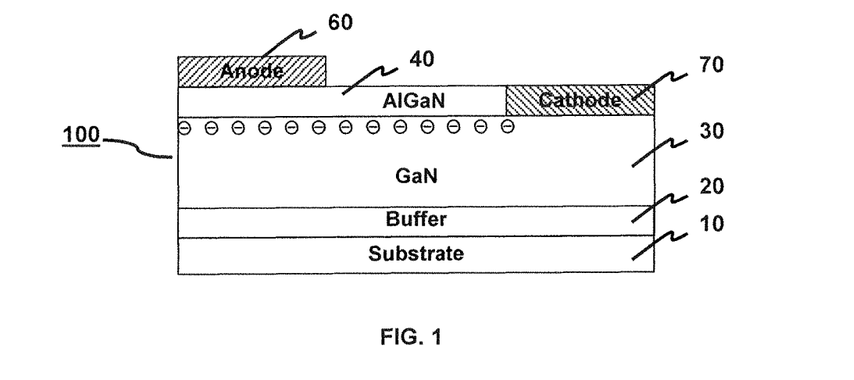
FIG. 1 shows an example of a GaN-based Schottky diode.

FIG. 1 shows an example of a GaN-based Schottky diode. The diode 100 includes a substrate 10, a buffer layer 20, a GaN layer 30 formed on the buffer layer 20 and an AlGaN layer 40 formed on the GaN layer 30. An anode 60 and cathode 70 serve as electrical contacts for the device. The anode 60 is formed on the AlGaN layer 40 and establishes a Schottky interface therewith. The cathode 70 is formed on the GaN layer 30 and establishes an ohmic contact therewith.

One problem with Schottky diodes such as the device shown in FIG. 1 is that they often have a high forward voltage drop. This problem occurs because the conducting current has to travel through the relatively large potential barrier established by the Schottky contact on the AlGaN layer. In general, the larger the potential Schottky barrier the larger the resulting forward voltage drop. One way to ameliorate this problem is to reduce the thickness of the AlGaN layer. Unfortunately, however, this also reduces the two-dimensional electron gas underneath the AlGaN layer. For instance, the potential barrier of a Schottky contact formed by a Ni/Au metal on an $Al_xGaN$ layer is about 1.1 eV, whereas the potential barrier of a high voltage silicon-based Schottky diode is about 0.7 eV, which results in a significantly lower forward voltage drop.

SUMMARY

In accordance with one aspect of the invention, a semiconductor device includes a substrate, a first active layer disposed over the substrate and a second active layer disposed on the first active layer. The second active layer has a higher bandgap than the first active layer such that a two-dimensional electron gas layer arises between the first active layer and the second active layer. A first electrode has a first portion disposed in a recess in the second active layer and a second portion disposed on the second active layer such that a Schottky junction is formed therewith. The first portion of the first electrode has a lower Schottky potential barrier than the second portion of the first electrode. A second electrode is in contact with the first active layer. The second electrode establishes an ohmic junction with the first active layer.

In accordance with another aspect of the invention, a method of forming a semiconductor device is provided. The method includes forming a first active layer on a substrate and forming a second active layer over the first active layer. The second active layer has a higher bandgap than the first active layer such that a two-dimensional electron gas layer arises between the first active layer and the second active layer. A first electrode is formed on the second active layer such that a Schottky junction is formed therewith. The first electrode has a first portion disposed on the second active layer and a second portion in contact with the two-dimensional gas. The first portion of the first electrode has a higher Schottky potential barrier than the second portion of the first electrode. A second electrode is formed on the first active layer to form an ohmic junction therewith.

DETAILED DESCRIPTION

It has been found that the Schottky potential barrier of a Schottky diode can be reduced with the use of a dual-metal Schottky electrode in which the electrode is formed from two metals, one with a relatively high potential barrier and another with a relatively low potential barrier. For instance, as shown in N. Ikeda et al., "A Novel GaN Device with Thin AlGaN/GaN Heterostructure for High-Power Applications," *Furukawa Review*, 26, 1 (2006), a dual-metal Schottky electrode is employed which embeds a lower potential barrier metal within a higher potential barrier metal.

Figure 2:
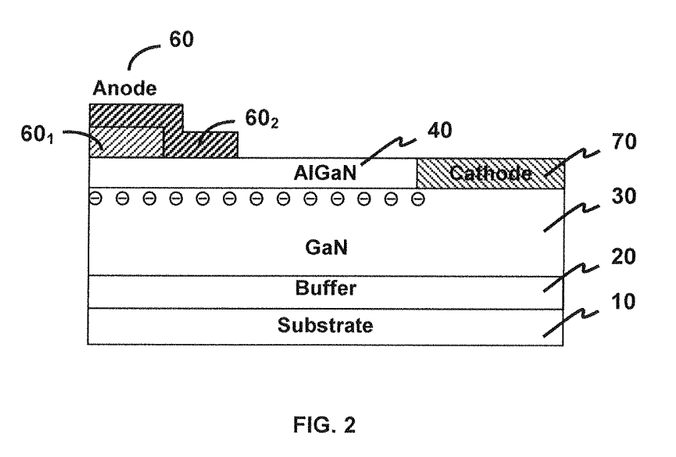
FIG. 2 shows an example of a GaN field-effect Schottky barrier diode (FESBD).

FIG. 2 shows one example of such a dual-metal Schottky electrode device, which is referred to herein as a field effect Schottky barrier diode (FESBD). In FIGS. 1 and 2 like elements are denoted by like reference numerals. The diode 100 includes a substrate 10, a buffer layer 20, a GaN layer 30 formed on the buffer layer 20 and an AlGaN layer 40 formed on the GaN layer 30. An anode 60 and cathode 70 serve as electrical contacts for the device. The anode 60 includes a first portion $60_1$ with a lower potential barrier and a second portion $60_2$ with a higher potential barrier. The anode 60 is formed on the AlGaN layer 40 and establishes a Schottky interface therewith. The cathode 70 is formed on the GaN layer 30 and establishes an ohmic contact therewith.

When the FESBD operates in the forward regime the forward voltage drop can be significantly reduced because of the presence of the lower potential barrier metal. When operating in the reverse regime the higher potential barrier metal will still pinch off the two-dimensional electron channel at about the same reverse voltage that would pinch-off the channel in a device having an electrode formed only from the higher potential barrier metal. As a result, the use of two-metal electrode in the Schottky diode reduces the forward voltage without substantially decreasing the reverse blocking voltage.

Figure 3:
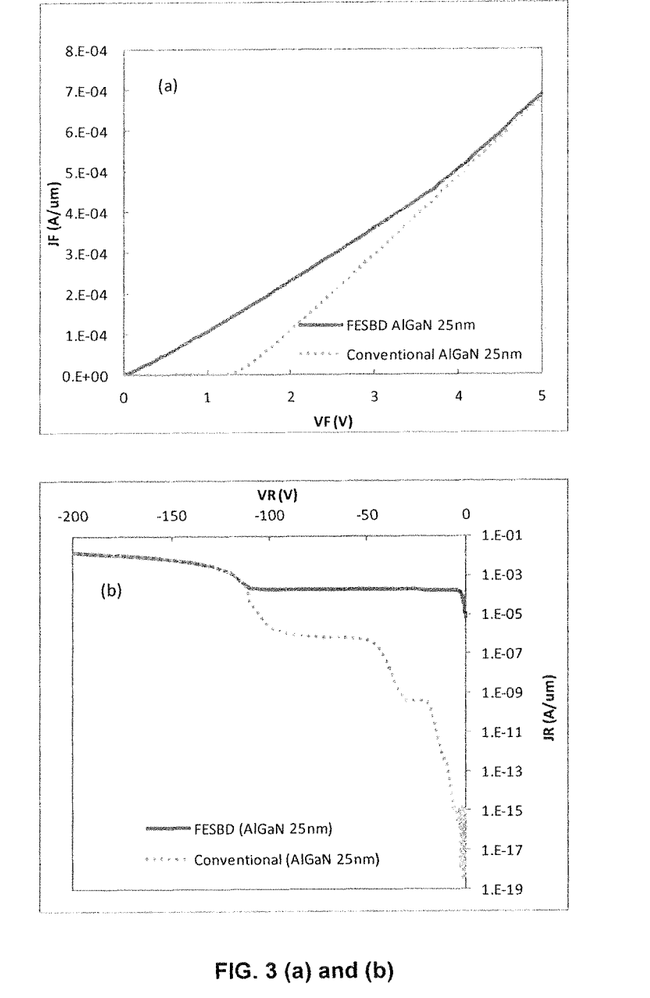
FIGS. 3a and 3b show the current voltage curves of FESBD and a conventional GaN Schottky diode under forward and reverse bias, respectively.

One limitation of the field effect Schottky barrier diode is that its on-resistance becomes large as the AlGaN thickness increases and thus is only useful in practice when the AlGaN layer thickness is very small, generally around 5 nanometers. FIGS. 3a and 3b show the current voltage curves of a conventional Schottky diode under forward and reverse bias, respectively. The conventional diode has a Schottky metal of which the workfunction is the same as the high barrier height metal in FESBD. FIGS. 3a and 3b also show the current-voltage curves of a FESBD with a Schottky electrode formed from the two metals as shown in FIG. 2 and as described of the aforementioned Ikeda reference. Both devices shown in FIG. 3 have a relatively thick AlGaN layer (25 nanometers in this example). Although the forward voltage is relatively small for the FESBD, its on-resistance is large due to the barrier height of the higher potential barrier metal Since the AlGaN layer requires a critical thickness (e.g., about 5 nm, depending on Al %) for the two-dimensional electron gas to reach a high density, the use of a thin AlGaN layer in an FESBD in order to reduce its turn-on voltage is not quite practical because the thickness of AlGaN layer has to be precisely controlled. Thus, a more precise description of the operational characteristics of the FESBD is that it reduces the forward voltage without substantially decreasing the reverse blocking voltage for a given AlGaN thickness. Unfortunately, it is not applicable to commonly employed AlGaN/GaN epitaxial wafers because the AlGaN layer is generally grown thicker to maintain a high two-dimensional electron gas density and a low sheet resistivity. Moreover, it has been found that the FESBD has a relatively large leakage current, which is induced by the barrier height of the lower potential barrier metal.

Overall, the FESBD has been shown to have: i) a reduced forward voltage drop that is determined by the workfunction of the Schottky metal having the lower potential barrier; ii) a forward current density under a high bias that is dominated by the workfunction of the Schottky metal having the higher potential barrier; iii) an initial leakage current that is dominated by the low Schottky barrier metal; and iv) a substantial breakdown voltage that is determined by the workfunction of the high potential barrier metal.

As detailed below, the reduced blocking voltage in a FESBD which arises from the use of a thin AlGaN layer can be overcome by using a dual-metal Schottky electrode in which the metal with the lower potential barrier is recessed through the AlGaN layer so that it contacts the two-dimensional gas, while the metal with the higher potential barrier resides on the AlGaN surface. By recessing the anode in this manner the carriers can travel directly from the two-dimensional channel to the anode by thermionic emission without traveling across the AlGaN barrier, thereby increasing the current by reducing the potential barrier. Since the potential barrier is reduced, the forward voltage drop of the device is reduced. In addition, under a reverse bias, the high potential barrier metal on the non-recessed AlGaN layer will deplete and block the channel and improve the high leakage problem in FESBD. This electrode configuration has also been found to reduce the leakage current of the device.

Figure 4:
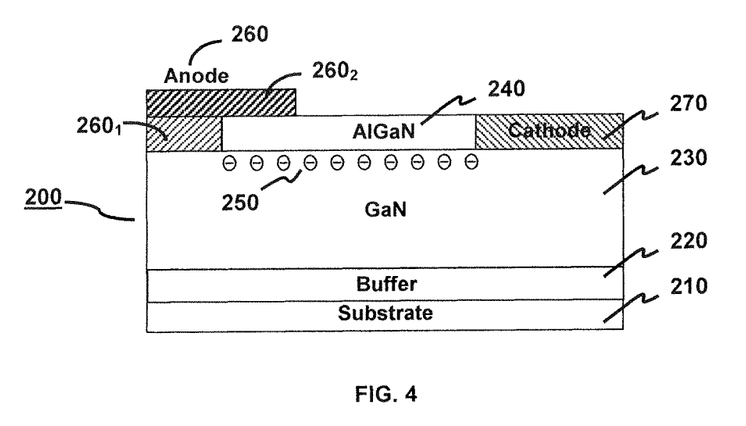
FIG. 4 shows one embodiment of a Schottky diode that employs a dual-metal, partially recessed anode.

FIG. 4 shows one embodiment of a Schottky diode 200 that employs a dual metal, partially recessed anode. Such a diode may be referred to as a Recessed Gate Field-Effect Schottky Barrier Diode (RGFESBD). The diode 200 can be fabricated from many different material systems. The diode 200 is shown as a single device for ease of description and understanding, but the diodes are typically fabricated at a wafer level and then divided into individual devices. In some cases thousands of devices can be fabricated from a single wafer level process.

The diode 200 is fabricated using a Group-III nitride based material system. Group-III nitrides include the semiconductor compounds formed between nitrogen and the elements in Group-III of the periodic table, usually aluminum (Al), gallium (Ga), and indium (In). This group also includes ternary and tertiary compounds such as AlGaN and AlInGaN. For illustrative purposes the diodes described below are formed from GaN and AlGaN, although other Group-III nitrides may be employed as well.

The diode 200 includes a substrate 210 that may be formed from various materials such as sapphire, silicon or silicon carbide. Various techniques of fabrication may employ one or more layers of materials to be disposed between the substrate 210 and the first active layer 230. For example, in some cases a buffer layer 220 may be formed on the substrate 210. Buffer layer 220 may be formed from GaN, AlGaN, or aluminum nitride (AlN) and provides an interface from the non-GaN substrate to a GaN-based active structure. Buffer layer 220 can reduce the defect concentration in the active device layers. Buffer layer 220 may be considered as part of substrate 210, whereby the remaining layers as formed on buffer layer 220 may be considered as device layers of the structure. In the example of FIG. 4 a first active layer 230 is comprised of gallium nitride (GaN). In other examples, different semiconductor materials containing nitride compounds of other elements from Group III of the Periodic Table of the Elements may comprise the first active layer 230.

The second active layer 240 in the example of FIG. 4 is comprised of aluminum gallium nitride (AlGaN). In other examples, different Group III nitride semiconductor materials such aluminum indium nitride (AlInN) and aluminum indium gallium nitride (AlInGaN) may comprise the second active layer 240. The material of the second active layer 240 may be a non-stoichiometric compound. In such materials, the ratios of the elements are not easily represented by ordinary whole numbers. For example, the second active layer 240 may be a non-stoichiometric compound of a Group III nitride semiconductor material such as $Al_XGa_{1-X}N$ where $0<X<1$.

As charge transfers from the second active layer 240 to the first active layer 230 because of the difference in bandgap between the materials, a planar region of high-charge, high mobility electrons is formed in the first active layer 230 at the interface between first and second active layers 230 and 240. The region of electric charge is sometimes called a two-dimensional electron gas 250 because electrons confined in the quantum well that results from the polarization effects of the III-nitride hetero-structure are free to move in two dimensions but are tightly confined in the third dimension.

The amount of charge that transfers across the second active layer 240 to the first active layer 230 to form electron gas 250 depends on the thickness and material concentration (e.g., Al percent composition) of the second active layer 240, which initially determines the amount of electrons in electron gas 250. In one embodiment, the second active layer 240 is formed from an AlGaN layer having a thickness within a range of about 0.01-0.04 microns. The AlGaN layer may be doped n-type, whereby the n-type dopant can be incorporated uniformly within second active layer 240, or in part of the layer only. The n-type dopant impurity in AlGaN layer may be silicon, for example.

Electrodes are disposed on the device and establish electrical connections to the active layers. In particular, a cathode 270 is formed on the first active layer 230 and establishes an ohmic junction therewith. Cathode 270 may be formed from any suitable metal.

A dual-metal, partially recessed anode 260 is in contact with the second active layer 240 and establishes a Schottky junction therewith. The anode 260 may be formed from any suitable pairs of materials for establishing a Schottky junction such as a metal or metal gallicide. Suitable metals may include nickel (Ni), platinum (Pt), titanium (Ti) and gold (Au).

As shown, dual-metal, partially recessed anode 260 includes a high potential portion $260_2$ that is situated on the second active layer 240 and a low potential portion $260_1$ that is situated within or on the first active layer 230. The material used to form the high potential portion $260_2$ of the anode 260 has a higher Schottky potential barrier than the low potential barrier portion $260_1$. For example, in one embodiment the low potential barrier material may be Mo or Cu, which has a potential barrier of 4.65 eV and the high potential barrier material may be Ni or Pd, which has a potential barrier of 5.15 eV.

The AlGaN layer is completely removed below the lower potential, recessed anode portion $260_1$ so that the recessed anode portion $260_1$ is in direct contact with the two-dimension electron gas. As a result the carriers can travel through a much lower potential barrier by thermionic emission as well as by tunneling. Therefore, the current density can increase significantly. Moreover, since the potential barrier is reduced, the forward voltage drop of the device is reduced while maintaining the overall thickness of the AlGaN layer outside of the recessed area. In this way a higher blocking voltage can be maintained than if the thickness of the entire AlGaN layer was reduced, as shown in Furukawa.

Figure 5:
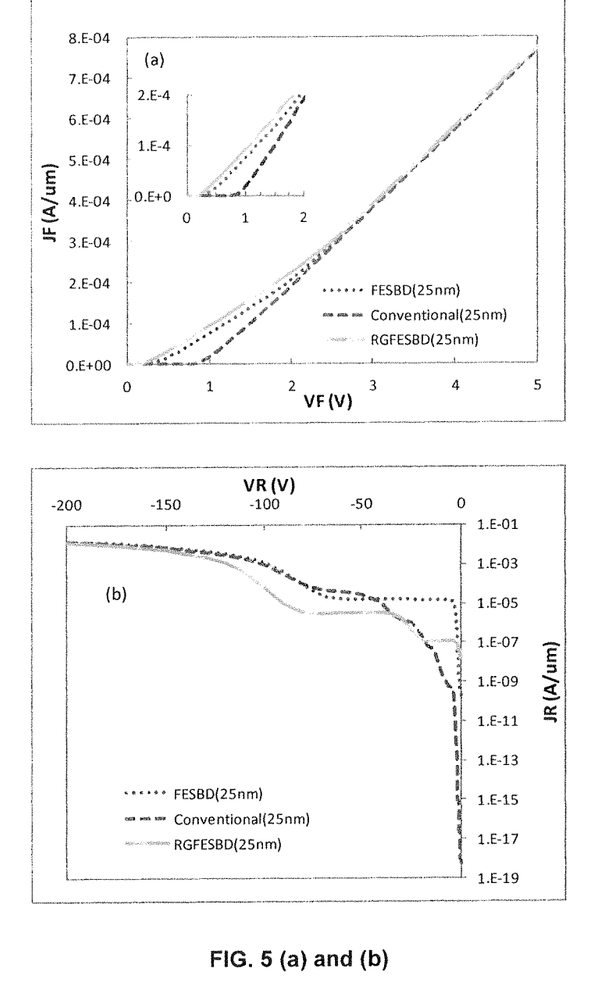
FIGS. 5a and 5b show a simulation of the forward and reverse current voltage (I-V) curves, respectively for a conventional AlGaN/GaN Schottky diode, a field effect Schottky barrier diode (FESBD) and the RGFESBD described herein.

FIGS. 5a and 5b show a simulation of the forward and reverse current voltage (I-V) curves, respectively for a conventional AlGaN/GaN Schottky diode, an FESBD and the RGFESBD described herein. In all cases the AlGaN layer is 25 nm thick with an Al composition of 25%, the GaN layer is an epitaxial layer 0.5 microns thick and the two-dimensional charge density is $8\times10^{12}$ $cm^{-2}$ at the AlGaN/GaN interface. The work functions of the two Schottky metals employed are 4.65 and 5.2 eV, which is a suitable combination of low and high work function metals that has been found to reduce the leakage current, while 5.2 eV for conventional SBD. As shown, the RGFESBD has the highest breakdown voltage of the group and a lower leakage current than the FESBD. Although the initial leakage current of the RGFESBD is higher than for a conventional Schottky diode as a result of the lower Schottky barrier, at large biases the leakage current is suppressed further by the charge depletion in the two-dimensional electron gas. Moreover, the performance of the RGFESBD under a forward bias is the best among the three devices, and its forward voltage drop is extremely low. In summary, the curves in FIG. 5 demonstrate that the use of a dual metal, partially recessed anode can significantly reduce the forward voltage drop while enhancing the breakdown voltage of the device.

Figure 6:
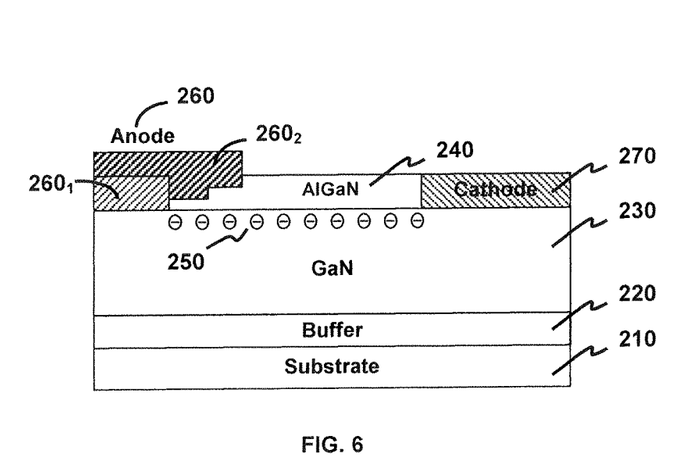
FIG. 6 shows an alternative embodiment of a Schottky diode that employs a dual-metal, partially recessed anode.

As shown in FIG. 4, the etch depth of the recessed portion of portion $260_1$ located within the AlGaN layer may be constant across the entire low potential recessed portion $260_1$. Alternatively, in some cases one or more segments of the high potential portion $260_2$ also may be recessed and located at different depths within the AlGaN layer. For instance, as shown in FIG. 6 some segments of the high potential portion $260_2$ of the anode 260 are recessed and may be etched so that different segments are located at different depths within the AlGaN layer 240. For instance, in FIG. 6, the recessed segments have a step-wise configuration. In FIGS. 4 and 6 as well as the figures that follow, like elements are denoted by like reference numerals.

Figure 7:
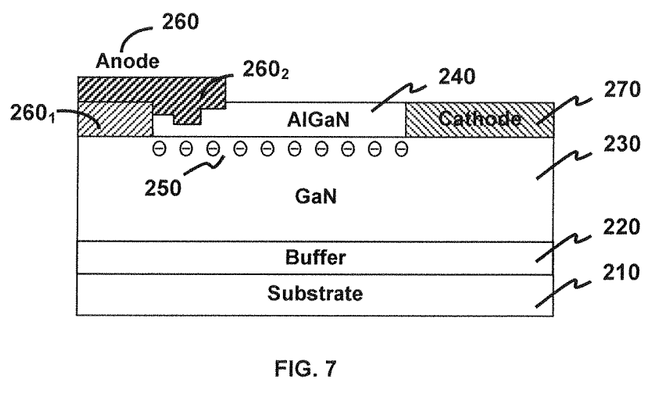
FIG. 7 shows another alternative embodiment of a Schottky diode that employs a dual-metal, partially recessed anode.

FIG. 7 shows another illustrative configuration of the dual-metal, partially recessed anode 260. In this example the partially recessed anode has a stepwise configuration as in FIG. 6 but the etch depth for the higher barrier portion $260_2$ increases and then decreases rather than simply increasing as in FIG. 6. Simulations have demonstrated that this configuration can also advantageously reduce the leakage current of the device.

Figure 8:
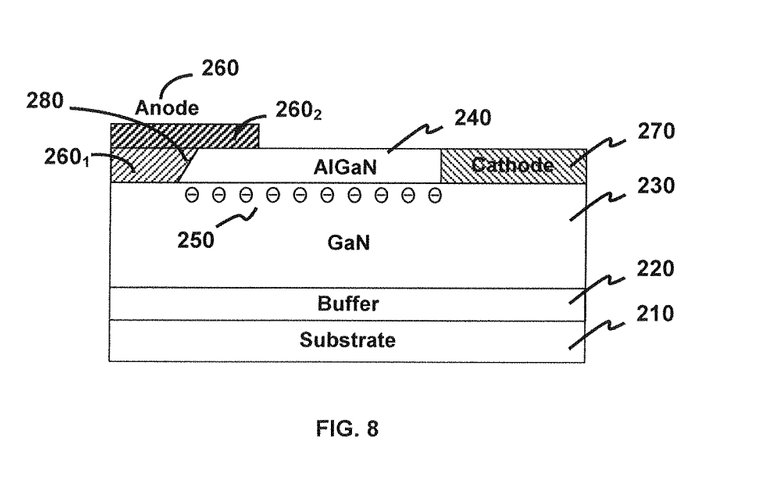
FIG. 8 shows yet another alternative embodiment of a Schottky diode that employs a dual-metal, partially recessed anode.

FIG. 8 illustrates yet another configuration of the dual-metal, partially recessed anode 260. In this example the edge 280 of the partially recessed anode adjacent to the AlGaN layer 240 does not extend in the vertical direction, but rather is sloped so that it forms a non-orthogonal angle with the GaN/AlGaN interface. As before, the low barrier portion $260_1$ is located within the recessed region formed in the AlGaN layer and the high barrier portion $260_2$ is located on the AlGaN surface.

In some embodiments the surface area (i.e., the area of the surface parallel to the plane in which the substrate extends) occupied by the lower potential portion $260_1$ of the anode 260 and the higher potential portion $260_2$ are about equal to one another. In other embodiments these surface areas may differ from one another. For example, in some embodiments it may be advantageous to make the surface area of the low barrier portion $260_1$ smaller than the surface area of the high barrier portion $260_2$. Such a configuration may reduce the leakage current in some cases. In general, the relative size of the different anode portions will depend on the particular device characteristics and the application in which the device is to be employed.

The GaN-based Schottky diode described herein may be fabricated using an epitaxial growth process. For instance, a reactive sputtering process may be used where the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, metal organic chemical vapor deposition (MOCVD) may be employed, wherein the substrate is exposed to an atmosphere containing organic compounds of the metals as well as to a reactive nitrogen-containing gas, such as ammonia, and a dopant-containing gas while the substrate is maintained at an elevated temperature, typically around 700-1100 C. The gaseous compounds decompose and form a doped semiconductor in the form of a film of crystalline material on the surface of the substrate. The substrate and the grown film are then cooled. As a further alternative, other epitaxial growth methods, such as molecular beam epitaxy (MBE) or atomic layer epitaxy may be used. Yet additional techniques that may be employed include, without limitation, Flow Modulation Organometallic Vapor Phase Epitaxy (FM-OMVPE), Organometallic Vapor-Phase Epitaxy (OMVPE), Hydride Vapor-Phase Epitaxy (HVPE), and Physical Vapor Deposition (PVD).

Standard metallization techniques, as known in the art of semiconductor fabrication, can be used to form the partially recessed anode. Illustrative metals which may be used to form Schottky junction include, by way of example, Nb, Ti, Cr, W, Mo, Ag, Cu, Co, Au, Pd, Ni, and Pt. Schottky metals with different work functions result in different barrier potentials. The recess in the second active layer (e.g., an AlGaN layer) in which the recessed portion of the anode is located may be formed using well known etching processes such as reactive ion etching (RIE), inductively coupled plasma (ICP), or electron cyclotron resonance (ECR) plasma etching.

Figure 9:
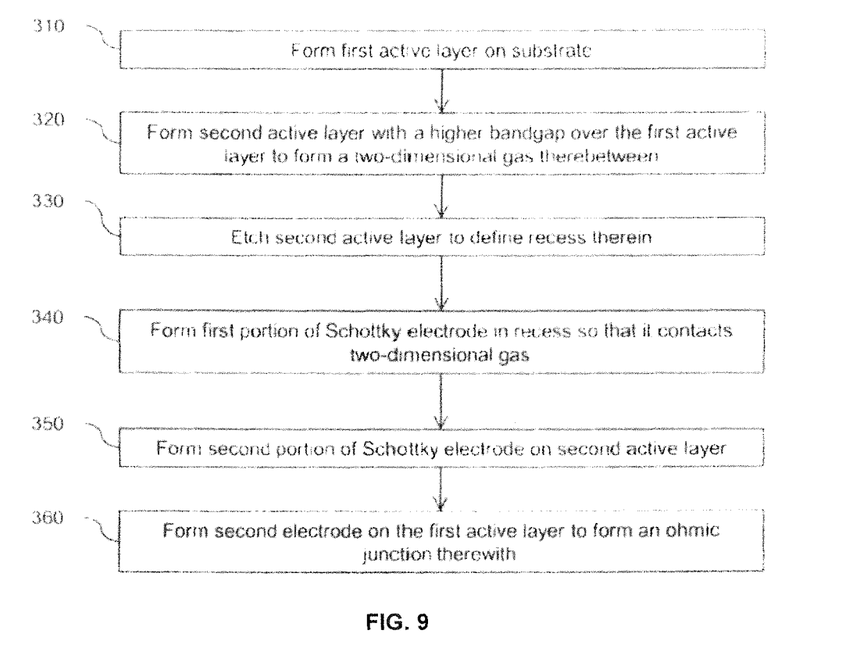
FIG. 9 is a flowchart showing one example of a method for forming a semiconductor device such as a Schottky diode that employs a dual-metal, partially recessed anode.

FIG. 9 is a flowchart showing one example of a method for forming a semiconductor device. The method includes forming a first active layer on a substrate at block 310. A second active layer is formed over the first active layer at block 320. The active layer has a higher bandgap than the first active layer such that a two-dimensional electron gas layer arises between the first active layer and the second active layer. A portion of the second active layer is removed by etching to define a recess at block 330. A first portion of a Schottky electrode is formed in the recess at block 340. A second portion of the Schottky electrode is then formed on the second active layer at block 350. The first portion of the Schottky is in contact with the two-dimensional gas. The Schottky metals are chosen to have different workfunctions, with the first portion of the Schottky electrode typically having a lower workfunction than the second portion of the Schottky electrode. A second electrode is formed on the first active layer at block 360 to create an Ohmic junction therewith by direct metal deposition on the first active layer or by metal deposition on the second active layer plus an alloying process to reach the first active layer.

The above examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

The invention claimed is:

1. A semiconductor device, comprising:
a substrate;
a first active layer disposed over the substrate; a second active layer disposed on the first active layer, the second active layer having a higher bandgap than the first active layer such that a two-dimensional electron gas layer arises between the first active layer and the second active layer;
a first electrode having a first portion disposed in a recess in the second active layer such that said second active layer is completely removed below the first portion of said first electrode, and a second portion disposed directly on the second active layer such that a Schottky junction is formed therewith, said first portion of the first electrode having a lower Schottky potential barrier than said second portion of the first electrode; and
a second electrode in contact with the first active layer, said second electrode establishing an ohmic junction with the first active layer.

2. The semiconductor device of claim 1 wherein the first portion of the first electrode is in contact with the two-dimensional electron gas.

3. The semiconductor device of claim 1 wherein the second portion of the first electrode comprises a plurality of segments that are each located at a different depth within the recess in the second active layer.

4. The semiconductor device of claim 3 wherein the plurality of segments are located at different depths completely within said second active layer in a stepwise manner.

5. The semiconductor device of claim 1 in which the first portion of the first electrode has an edge adjacent to the second active layer that defines a non-orthogonal angle with an interface between the first and second active layers.

6. The semiconductor device of claim 1 in which the first portion of the first electrode has a surface area parallel to a plane in which the substrate extends that is smaller than a surface area of the second portion of the first electrode, said surface area of the second portion of the first electrode being parallel to a plane which the substrate extends.

7. The semiconductor device of claim 1, wherein the first active layer comprises a group III nitride semiconductor material.

8. The semiconductor device of claim 7, wherein the first active layer comprises GaN.

9. The semiconductor device of claim 1, wherein the second active layer comprises a group III nitride semiconductor material.

10. The semiconductor device of claim 9, wherein the second active layer comprises $Al_XGa_{1-X}N$, wherein $0<X<1$.

11. The semiconductor device of claim 9, wherein the second active layer is selected from the group consisting of AlGaN, AlInN, and AlInGaN.

12. A method of forming a semiconductor device, comprising:
forming a first active layer on a substrate;
forming a second active layer over the first active layer, the second active layer having a higher bandgap than the first active layer such that a two-dimensional electron gas layer arises between the first active layer and the second active layer;
forming a first electrode on the second active layer such that a Schottky junction is formed therewith, the first electrode having a first portion disposed directly on the second active layer and a second portion, wherein the second active layer has been completely removed beneath the second portion, such that the second portion is in contact with the two-dimensional gas, said first portion of the first electrode having a higher Schottky potential barrier than said second portion of the first electrode; and
forming a second electrode on the first active layer to form an ohmic junction therewith.

13. The method of claim 12 wherein the second portion of the first electrode comprises a plurality of segments that are each located at a different depth within the recess in the second active layer.

14. The method of claim 13 wherein the plurality of segments are located at different depths completely within said second active layer in a stepwise manner.

15. The method of claim 12 in which the first portion of the first electrode has an edge adjacent to the second active layer that defines a non-orthogonal angle with an interface between the first and second active layers.

16. The method of claim 12 in which the second portion of the first electrode has a surface area parallel to a plane in which the substrate extends that is smaller than a surface area of the first portion of the first electrode, said surface area of the first portion of the first electrode being parallel to a plane which the substrate extends.

17. The method of claim 12, wherein the first active layer comprises a group III nitride semiconductor material.

18. The method of claim 17, wherein the first active layer comprises GaN.

19. The method of claim 12, wherein the second active layer comprises a group III nitride semiconductor material.

20. The method of claim 19, wherein the second active layer comprises $Al_xGa_{1-x}N$, wherein $0<X<1$.

* * * * *